United States Patent
Wu

(10) Patent No.: US 6,635,953 B2
(45) Date of Patent: Oct. 21, 2003

(54) IC CHIP PACKAGE

(75) Inventor: Cheng-Chiao Wu, Taichung (TW)

(73) Assignee: Taiwan Electronic Packaging Co., Ltd., Hsin Chu (TW)

( * ) Notice: Subject to any disclaimer, the term of this patent is extended or adjusted under 35 U.S.C. 154(b) by 0 days.

(21) Appl. No.: 10/036,439

(22) Filed: Jan. 7, 2002

(65) Prior Publication Data

US 2002/0089039 A1 Jul. 11, 2002

(30) Foreign Application Priority Data

Jan. 9, 2001 (CN) .......................................... 01200427

(51) Int. Cl.[7] ............................................ H01L 23/552
(52) U.S. Cl. ....................... 257/659; 257/666; 257/674; 257/691; 257/701; 257/704; 257/711
(58) Field of Search ................................ 257/704, 711, 257/691, 659, 666, 674

(56) References Cited

U.S. PATENT DOCUMENTS

| | | | | |
|---|---|---|---|---|
| 4,646,129 A | * | 2/1987 | Yerman et al. ................ 357/74 |
| 5,296,724 A | * | 3/1994 | Ogata et al. ................... 257/98 |
| 5,532,513 A | * | 7/1996 | Smith et al. ................. 257/703 |
| 5,739,584 A | * | 4/1998 | Pasch ......................... 257/697 |
| 6,111,199 A | * | 8/2000 | Wyland et al. ............. 147/52.2 |

* cited by examiner

*Primary Examiner*—Long Pham
*Assistant Examiner*—Wai-Sing Louie

(57) ABSTRACT

An IC chip package is constructed to comprise a substrate, a chip, adhesive means, and a cover. The substrate comprises a top side and a receiving chamber, the receiving chamber having an opening disposed in the top side. The top side of the substrate is provided with a plurality of connecting pads arranged around the opening of the receiving chamber. The chip is fixedly mounted in the receiving chamber and is provided with a plurality of connecting pads respectively electrically connected to the connecting pads of the substrate by means of bonding wires. The adhesive means is applied on the connecting area between the bonding wires and the connecting pads of the substrate. The cover is fixedly fastened to the adhesive means to close the opening of the receiving chamber.

19 Claims, 3 Drawing Sheets

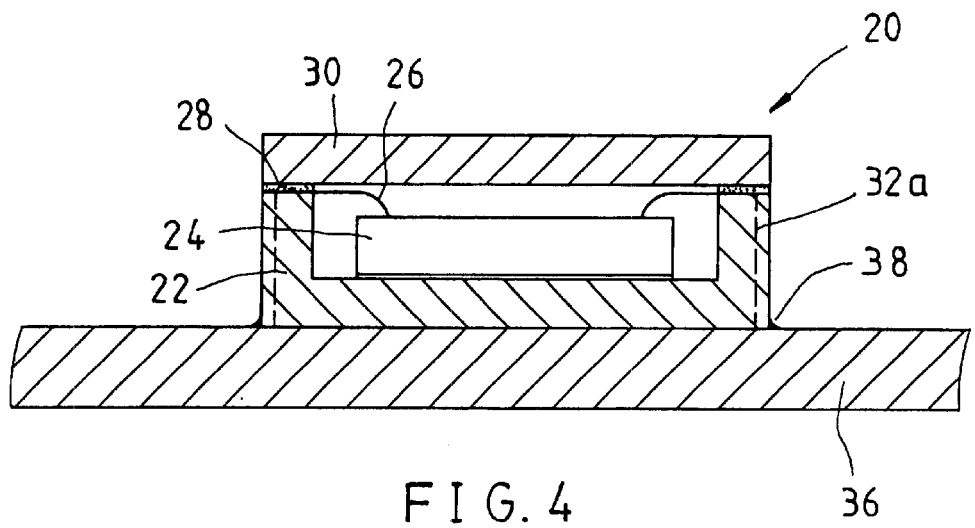
F I G. 4
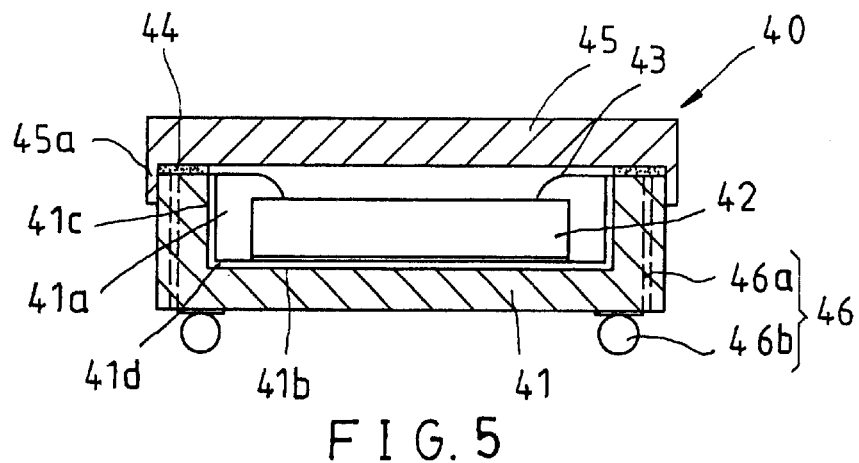
F I G. 5
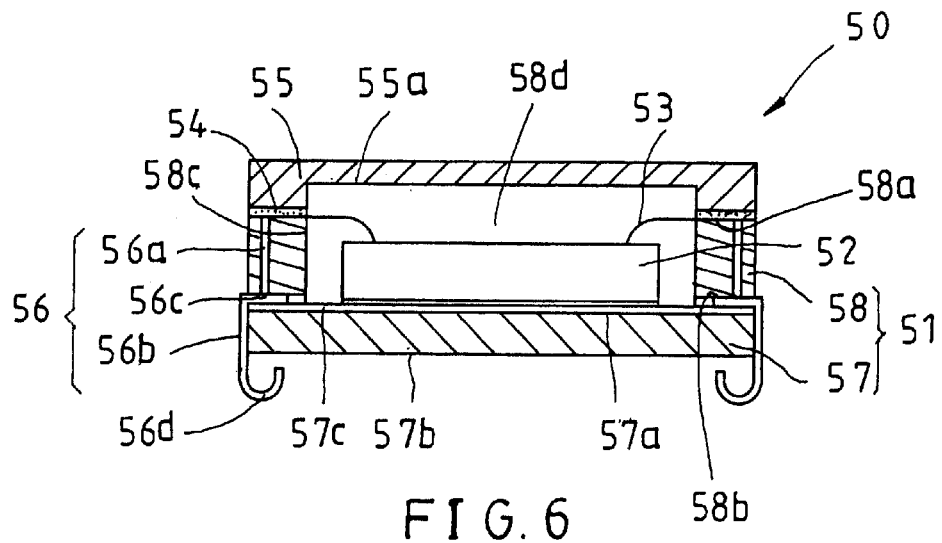
F I G. 6

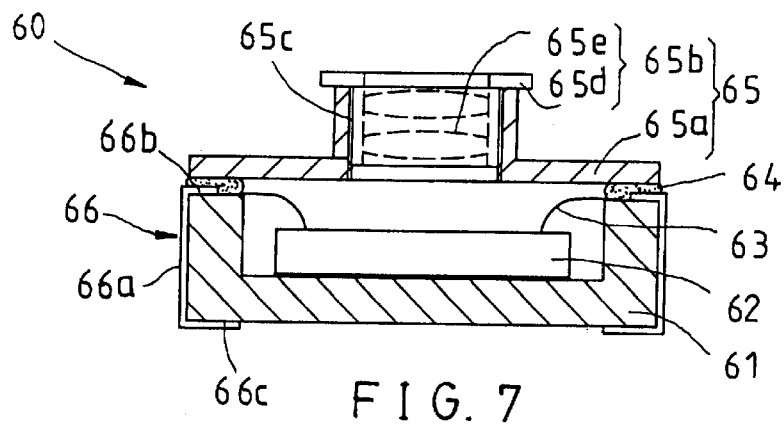
F I G. 7
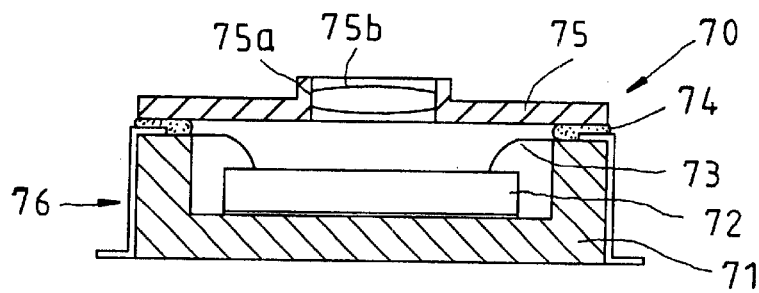
F I G. 8
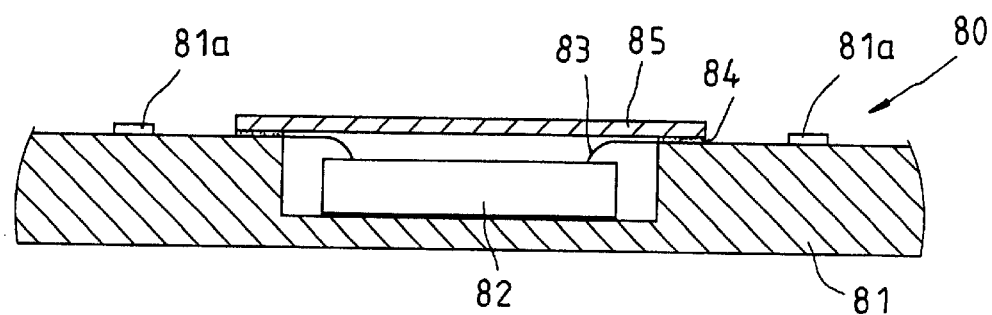
F I G. 9
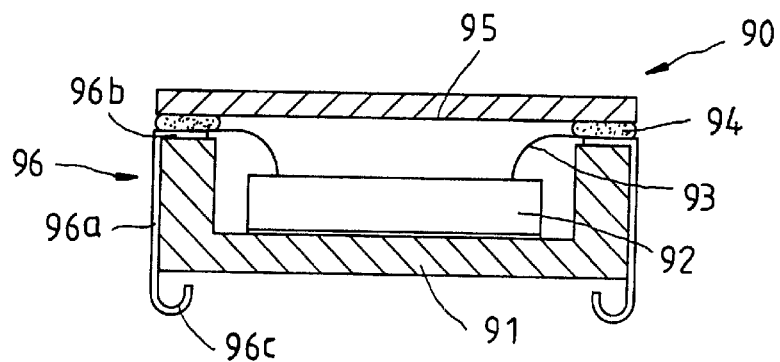
F I G. 10

IC CHIP PACKAGE

FIELD OF THE INVENTION

The present invention relates generally to an IC chip package, and more particularly to a small size IC chip package.

BACKGROUND OF THE INVENTION

FIG. 1 illustrates an IC chip package according to the prior art. The package 10 comprises generally a substrate 11, a chip 12, and a cover 13. The substrate 11 has a top-open receiving chamber 14 and a certain number of connecting pads 16 of predetermined shapes arranged in the receiving chamber 14 at the bottom. The chip 12 is adhered to the central portion of the bottom of the receiving chamber 14, and electrically connected to the connecting pads 16 by bonding wires 17. The cover 13 closes the open side of the substrate 11 to protect the chip 12 against external impact or pollutant. The cover 13 shall be made of transparent material in case the chip 12 is a video chip.

In the aforesaid package 10, the bottom of the receiving chamber 14 must receive the chip 12 and the connecting pads 16 of the substrate 11, and sufficient space should be provided between the chip 12 and the wall of the receiving chamber 14 for the movement of the wire bonding tool 18, and therefore, the area of the bottom of the receiving chamber 14 must be much greater than the chip. Due to the aforesaid reasons, this package does not meet the requirements for light, thin, small, and short electronic products.

Further, if the manufacturing of the substrate 11 of the aforesaid package 10 is based on plastic printing circuit board, moisture will pass to the inside of the receiving chamber 14 after a long use, thereby affecting the functioning of the chip 12. In order to eliminate this problem, a waterproof isolating layer must be added to the bottom of the receiving chamber 14. However, the installation of this isolating layer is complicated because the presence of the isolating layer must not interfere with the connection between the bonding wires 17 and the connecting pads 16. Improper installation of the isolating layer cannot achieve the desired waterproof effect. Some manufacturers use ceramic material to make the substrate 11 instead of plastic material. However, the manufacturing cost of a ceramic printing circuit board is much higher than a plastic printing circuit. Further, ceramic material cannot isolate moisture completely.

SUMMARY OF THE INVENTION

The primary object of the present invention is to provide an IC chip package, which achieves the requirement for small dimensions.

It is another object of the present invention to provide an IC chip package, which effectively isolates moisture and, is inexpensive to manufacture.

To achieve these objects of the present invention, the IC chip package of the present invention comprises a substrate, the substrate having a top side, a bottom side, and a receiving chamber, the receiving chamber having an opening disposed in the top side, the top side of the substrate having a plurality of connecting pads arranged around the opening of the receiving chamber; a chip fixedly mounted in the receiving chamber of the substrate, the chip comprising a plurality of connecting pads; a plurality of bonding wires respectively electrically connected between the connecting pads at the substrate and the connecting pads at the chip; adhesive means provided in the connecting area between the bonding wires and the connecting pads of the substrate; and a cover fixedly fastened to the adhesive means to close the opening of the receiving chamber.

BRIEF DESCRIPTION OF THE DRAWINGS

FIG. 4 is a schematic drawing showing the use of the first preferred embodiment of the present invention.

FIG. 5 is a sectional view of an IC chip package constructed according to a second preferred embodiment of the present invention.

FIG. 6 is a sectional view of an IC chip package constructed according to a third preferred embodiment of the present invention.

FIG. 7 is a sectional view of an IC chip package constructed according to a fourth preferred embodiment of the present invention.

FIG. 8 is a sectional view of an IC chip package constructed according to a fifth preferred embodiment of the present invention.

FIG. 9 is a sectional view of an IC chip package constructed according to a sixth preferred embodiment of the present invention.

FIG. 10 is a sectional view of an IC chip package constructed according to a seventh preferred embodiment of the present invention.

DETAILED DESCRIPTION OF THE INVENTION

Figure 1:
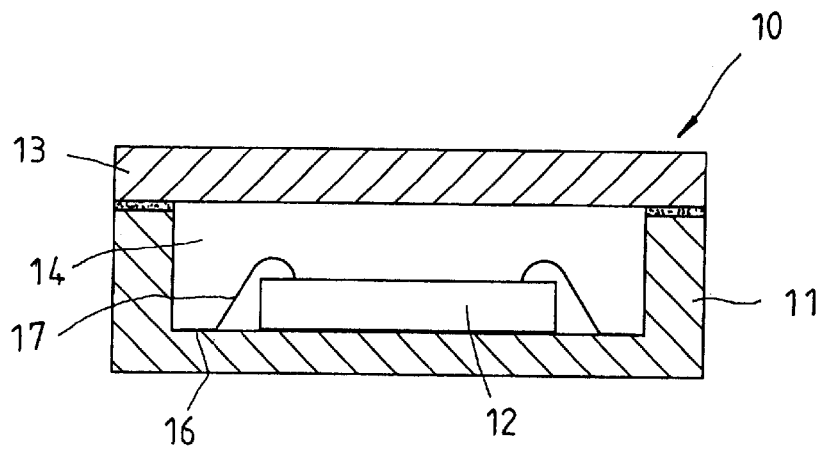
FIG. 1 is a sectional view showing an IC chip package constructed according to the prior art.
Figure 2:
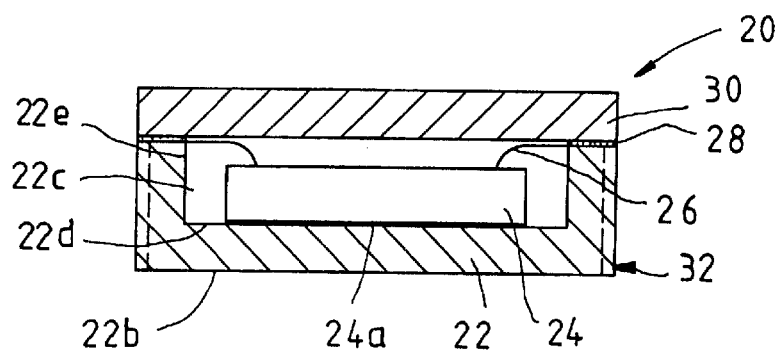
FIG. 2 is a sectional view of an IC chip package constructed according to a first preferred embodiment of the present invention.
Figure 3:
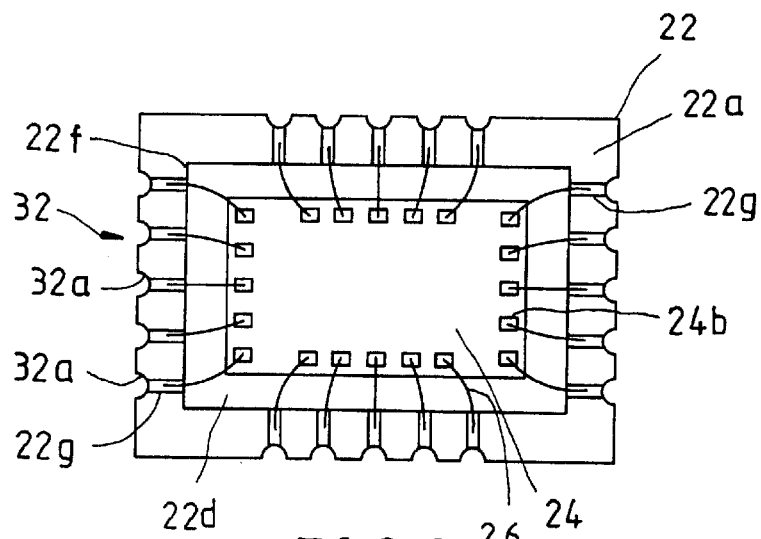
FIG. 3 is a top view of the IC chip package according to the first preferred embodiment of the present invention, wherein the cover is not shown.

Referring to FIGS. from 2 through 4, an IC chip package 20 in accordance with a first preferred embodiment of the present invention is shown comprised of a substrate 22, a chip 24, bonding wires 26, adhesive means 28, a cover 30, and a connecting device 32.

The substrate 22 is a PCB (printed circuit board) made of plastics, glass fibers, reinforced plastic material, ceramics, etc., having a top side 22a, a bottom side 22b, and a receiving chamber 22c. The receiving chamber 22c has a bottom 22d, a peripheral wall 22e around the border of the bottom wall 22d, and an opening 22f in the topside 22a in communication with the outside. The topside 22a is provided with a plurality of connecting pads 22g around the opening 22f.

The chip 24 is fastened to the bottom 22d of the receiving chamber 22c by adhesive 24a. The surface of the chip 24 is provided with connecting pads 24b.

The bonding wires 26 are made of gold or aluminum alloy, having one ends respectively fastened to the connecting pads 24b of the chip 24 by a wire bonding tool (not shown), and an opposite ends extended out in horizontal respectively connected to the connecting pads 22g of the substrate 22.

The adhesive means 28 can be made from silicones, epoxies, acrylics, polyamides, low melting point glass or double-sided adhesive tape. The adhesive means 28 is applied to the top side 22a of the substrate 22 and covers over the connection area between the bonding wires 28 and the connecting pads 22g of the substrate 22.

The cover 30 can be an opaque plate member made of plastics or metal, or a transparent plate member made of glass or plastics, having one side bonded to the adhesive means 28 to close the opening 22f of the receiving chamber 22c and to protect the chip 24 against external impact or pollutant.

The connecting device 32 is adapted to electrically connect the connecting pads 22g of the substrate 22 to the outside of the substrate 22. According to this embodiment, the connecting device 32 is provided around the periphery of the substrate 22 with a plurality of plated through holes 32a to connect the connecting pads 22g at the top side 22a of the substrate 22 to the bottom side 22b of the substrate 22. When the package 20 is installed in an external circuit board 36, as shown in FIG. 4, tin solder 38 is connected to the through holes 32a, thereby causing the chip 24 to be electrically connected to the conductive circuit pattern (not shown) of the circuit board 36.

According to the aforesaid arrangement, the bottom 22d of the receiving chamber 22c of the substrate 22 receives the chip 24 only, the second solder points (connecting pads 22g) of the bonding wires 26 are disposed at the top side 22a of the substrate 22 where there is an open space convenient for the operation of a wire bonding tool 18. Therefore, the area of the bottom 22d of the receiving chamber 22c can be made as small as the area of the chip 24 to minimize the imensions of the package 20, so as to achieve the requirement for a chip size package and eliminate the drawbacks of the prior art designs.

FIG. 5 shows an IC chip package 40 constructed according to a second preferred embodiment of the present invention. According to this embodiment, the IC chip package 40 comprises a substrate 41, a chip 42, bonding wires 43, adhesive means 44, a cover 45, and a connecting device 46. The differences between this embodiment and the aforesaid first embodiment of the present invention are outlined hereinafter.

The substrate 41 has a metal moisture-proof layer 41d at the bottom 41b and peripheral wall 41c of the receiving chamber 41a of the substrate 41. The chip 42 is fixedly mounted on the waterproof layer 41d.

The cover 45 has a flange 45a, which is connected to the outside wall of the substrate 41 to secure the cover 45 to the substrate 41 positively.

Further, the connecting device 46 comprises a plurality of plated through holes 46a connected between the connecting pads (not shown) at the top side of the substrate 41 and the bottom side of the substrate 41, and a plurality of solder balls 46b arranged at the bottom side of the substrate 41 and electrically connected to the plated through holes 46a. The moisture-proof layer 41d effectively prohibits moisture from passing to the inside of the receiving chamber 41a, and provides a good heat dissipation effect. Further, the substrate 41 can be made of plastic material to reduce the cost.

FIG. 6 shows an IC chip package 50 constructed according to a third preferred embodiment of the present invention. According to this embodiment, the IC chip package 50 comprises a substrate 51, a chip 52, bonding wires 53, adhesive means 54, a cover 55, and a connecting device 56.

The substrate 51 comprises a plate member 57 and a frame 58. The plate member 57 has a top side 57a and a bottom side 57b. The topside 57a of the plate member 57 is covered with a metal moisture-proof layer 57c. The frame 58 has a top side 58a, a bottom side 58b, and a hole 58c through the topside 58a and the bottom side 58b. The topside 58a of the frame 58 is provided with connecting pads (not shown).

The bottom side 58b of the frame 58 is fixedly fastened to the moisture-proof layer 57c mat the topside 57a of the plate member 57, blocking the orifice of the hole 58c in the bottom side 58b of the frame 58. Therefore, the peripheral wall of the hole 58c defines with the topside 57a of the plate member 57 a receiving chamber 58d, which receives the chip 52.

Further, the cover 55 has a recessed portion 55a in one side facing the receiving chamber 58d to provide a space for the receiving chamber 58d, preventing the cover 55 from touching the bonding wires 53.

According to this embodiment, the connecting device 56 comprises plated through holes 56a connected between the connecting pads at the topside 58a of the frame 58 and the bottom side 58b of the frame 58, and metal leads 56b. The leads 56b each have one end 56c sandwiched in between the bottom side 58b of the frame 58 and the top side 57a of the plate member 57 and electrically connected to the plated through holes 56a, and the other end 56d extended to the outside of the substrate 51 and bent into a predetermined shape.

FIG. 7 shows an IC chip package 60 constructed according to a fourth preferred embodiment of the present invention. According to this embodiment, the IC chip package 60 comprises a substrate 61, a chip 62, bonding wires 63, adhesive means 64, a cover 65, and a connecting device 66.

The cover 65 comprises a cover body 65a and a lens unit 65b. The cover body 65a is fixedly fastened to the adhesive means 64, having a screw hole 65c through top and bottom sides. The lens unit 65b comprises a barrel 65d, and at least one lens 65e sealed in the barrel 65d. The barrel 65 is threaded into the screw hole 65c. Because the barrel 65 is fastened to the cover body 65a by a screw joint, the user can conveniently adjust the distance (focal distance) between the lens unit 65b and the chip 62. Alternatively, the barrel 65 can be fastened to the cover body 65a by any of a variety of conventional techniques instead of the screw joint.

According to this embodiment, the connecting device 66 comprises a plurality of metal leads 66a, each having one end 66b respectively electrically connected to the connecting pads at the top side of the substrate 61 and the other end 66c extended to the outside of the substrate 61 and bent into a predetermined shape.

FIG. 8 shows an IC chip package 70 constructed according to a fifth preferred embodiment of the present invention. According to this embodiment, the IC chip package 70 comprises a substrate 71, a chip 72, bonding wires 73, adhesive means 74, a cover 75, and a connecting device 76.

The cover 75 has a through hole 75a aimed at the chip 72, and at least one lens 75b mounted in the through hole 75a.

FIG. 9 shows an IC chip package 80 constructed according to a sixth preferred embodiment of the present invention. According to this embodiment, the IC chip package 80 comprises a substrate 81, a chip 82, bonding wires 83, adhesive means 84, and a cover 75. The difference between the sixth embodiment and the aforesaid first embodiment is at the substrate. According to the sixth embodiment, the substrate 81 has electronic elements 81a installed in the topside. The electronic elements 81a are electrically connected to respective connecting pads (not shown) at the topside of the substrate 81 by conductive circuit pattern (not shown). Thus, the package 80 is used as a module having a special function.

FIG. 10 shows an IC chip package 90 constructed according to a seventh preferred embodiment of the present invention. According to this embodiment, the IC chip package 90 comprises a substrate 91, a chip 92, bonding wires 93, adhesive means 94, a cover 95, and a connecting device 96. The difference between the seventh embodiment and the aforesaid other embodiments of the present invention is at the arrangement of the connecting device. According to this seventh embodiment, the connecting device 96 comprises metal leads 96a. Each lead 86a has one end 96b disposed at the top side of the substrate 91 and provided with a connecting pad (not shown), which is connected to one bonding wire 93, and the other end 96c extended to the outside of the substrate 91 and bent into a predetermined shape.

What is claimed is:

1. An IC chip packaging comprising:
    a substrate having a top side, a bottom side, a side wall around the periphery of the bottom side extending up in a straight line between the bottom side and the top side, and a receiving chamber formed by the side wall and the bottom side having a uniform cross section between the bottom side and the top side of the substrate, said receiving chamber having an opening disposed in the top side of said substrate, the top side of said substrate having a plurality of connecting pads arranged around the opening of said receiving chamber;
    a chip mounted in said receiving chamber of said substrate adjacent to the side wall so as to produce a space between the chip and the side wall smaller than that necessary to permit movement therein of a wire bonding tool and having a plurality of connecting pads on the top side of the chip;
    a plurality of bonding wires respectively electrically connected between the connecting pads on the top side of said substrate and the connecting pads on said chip;
    adhesive means applied on a connecting area between said bonding wires and the connecting pads of said substrate; and
    a cover fixedly fastened to said adhesive means to close the opening of said receiving chamber.

2. The IC chip package as claimed in claim 1, wherein said receiving chamber has a moisture-proof layer covering the bottom side and the side wall of said receiving chamber and holding said chip in said receiving chamber.

3. The IC chip package as claimed in claim 2, wherein said moisture-proof layer is made of metal.

4. The IC chip package as claimed in claim 1, wherein said substrate comprises:
    a plate member having a top side and a bottom side; and
    a frame having a top side, a bottom side, and a hole extended through the top side and bottom side of said frame, the top side of said frame is provided with said connecting pads of said substrate, the bottom side is mounted on the top side of said plate member such that a peripheral wall of the hole of said frame defines with the top side of the plate member said receiving chamber.

5. The IC chip package as claimed in claim 4, wherein the top side of said plate member has a moisture-proof layer, and the bottom side of said frame is fixed to said moisture-proof layer.

6. The IC chip package as claimed in claim 5, wherein said moisture-proof layer is made of metal.

7. The IC chip package as claimed in claim 4 further comprising a connecting device, said connecting devices comprising a plurality of plated through holes respectively connected between the connecting pads at the top side of said frame and the bottom side of said frame, and a plurality of metal leads, said metal leads each having one end electrically connected to said plated through hole and sandwiched in between the bottom side of said frame and the top side of said plate member and an opposite end extended outside of said frame and bent into a predetermined shape.

8. The IC chip package as claimed in claim 1, wherein said substrate is made of materials selected from a group consisting of plastics, reinforced plastics, glass fibers, and ceramics.

9. The IC chip package as claimed in claim 1, wherein said adhesive means is made from materials selected from a group consisting of silicones, epoxies, acrylics, polyamides, and glass.

10. The IC chip package as claimed in claim 1, wherein said adhesive means is a double-sided adhesive tape.

11. The IC chip package as claimed in claim 1, wherein said cover is made of a transparent material.

12. The IC chip package as claimed in claim 1, wherein said cover has a through hole communicating with said receiving chamber, and at least one lens is fixed in the through hole of said cover.

13. The IC chip package as claimed in claim 1, wherein said cover comprises a cover body fastened to said adhesive means, said cover body comprising a screw hole extended through a top and a bottom side of said cover body, and a lens unit, said lens unit comprising a barrel threaded into the screw hole of said cover body and at least one lens mounted in said barrel.

14. The IC chip package as claimed in claim 1, wherein said substrate further comprises a plurality of electronic elements mounted on the top side thereof and electrically connected to the connecting pads at the top side of said substrate.

15. The IC chip package as claimed in claim 1 further comprising a connecting device adapted to electrically connect the connecting pads of said substrate to an external object outside said substrate.

16. The IC chip package as claimed in claim 15, wherein said connecting device comprises a plurality of plated through holes disposed in the side wall of said substrate and adapted to connect the connecting pads at the top side of said substrate to the bottom side of said substrate.

17. The IC chip package as claimed in claim 15, wherein said connecting device comprises a plurality of plated through holes electrically connected between the connecting pads at the top side of said substrate and the bottom side of said substrate respectively, and a plurality of solder balls provided at the bottom side of said substrate and respectively electrically connected to the plated through holes of said connecting device.

18. The IC chip package as claimed in claim 15, wherein said connecting device comprises a plurality of metal leads, said metal leads each having one end electrically connected to the connecting pads at the top side of said substrate respectively and an opposite end extended to the outside of said substrate and bent into a predetermined shape.

19. An IC chip packaging comprising:
    a substrate having a top side, a bottom side, a side wall around the periphery of the bottom, side, and a receiving chamber formed by the side wall and the bottom side, said receiving chamber having an opening disposed on the top side of said substrate, the top side of said substrate having a plurality of connecting pads arranged around the opening of said receiving chamber;
    a chip mounted in said receiving chamber of said substrate and having a plurality of connecting pads on a top side of the ship;
    a plurality of bonding wires respectively electrically connected between the connecting pads on the cop side of said substrate and the connecting pads on said chip;
    adhesive means applied on a connecting area between said bonding wires and the connecting pads of said substrate; and
    a cover fixedly fastened to said adhesive means to close the opening of said receiving chamber.

* * * * *